(12) United States Patent
Zhang et al.

(10) Patent No.: US 9,443,926 B2
(45) Date of Patent: Sep. 13, 2016

(54) FIELD-STOP REVERSE CONDUCTING INSULATED GATE BIPOLAR TRANSISTOR AND MANUFACTURING METHOD THEREFOR

(71) Applicant: CSMC TECHNOLOGIES FAB1 CO., LTD., Jiangsu (CN)

(72) Inventors: Shuo Zhang, Jiangsu (CN); Qiang Rui, Jiangsu (CN); Xiaoshe Deng, Jiangsu (CN); Genyi Wang, Jiangsu (CN)

(73) Assignee: CSMC TECHNOLOGIES FAB1 CO., LTD. (CN)

( * ) Notice: Subject to any disclaimer, the term of this patent is extended or adjusted under 35 U.S.C. 154(b) by 0 days.

(21) Appl. No.: 14/901,606

(22) PCT Filed: Jun. 6, 2014

(86) PCT No.: PCT/CN2014/079355
§ 371 (c)(1),
(2) Date: Dec. 28, 2015

(87) PCT Pub. No.: WO2014/206193
PCT Pub. Date: Dec. 31, 2014

(65) Prior Publication Data
US 2016/0240608 A1    Aug. 18, 2016

(30) Foreign Application Priority Data

Jun. 28, 2013 (CN) .......................... 2013 1 0271614

(51) Int. Cl.
*H01L 29/74* (2006.01)
*H01L 29/06* (2006.01)
*H01L 29/66* (2006.01)
*H01L 29/739* (2006.01)
*H01L 23/528* (2006.01)
*H01L 23/532* (2006.01)
*H01L 23/31* (2006.01)

(52) U.S. Cl.
CPC ....... *H01L 29/0607* (2013.01); *H01L 23/3171* (2013.01); *H01L 23/528* (2013.01); *H01L 23/53219* (2013.01); *H01L 23/53247* (2013.01); *H01L 29/66325* (2013.01); *H01L 29/7393* (2013.01)

(58) Field of Classification Search
CPC .................... H01L 29/0607; H01L 29/66325; H01L 29/7393; H01L 29/402; H01L 29/41708; H01L 23/3171; H01L 23/528; H01L 23/53219; H01L 23/53247
USPC ......................................................... 257/139
See application file for complete search history.

(56) References Cited

U.S. PATENT DOCUMENTS 7,723,817 B2 * 5/2010 Kanemaru ........ H01L 21/76275
257/510

*Primary Examiner* — Tu-Tu Ho
(74) *Attorney, Agent, or Firm* — Mark Malek; Daniel Pierron; Widerman Malek, PL

(57) ABSTRACT

A field-stop reverse conducting insulated gate bipolar transistor and a manufacturing method thereof. The transistor comprises a terminal structure (200) and an active region (100). An underlayment of the field-stop reverse conducting insulated gate bipolar transistor is an N-type underlayment, the back surface of the underlayment is provided with an N-type electric field stop layer (1), one surface of the electric field stop layer (1) departing from the underlayment is provided with a back-surface P-type structure (10), and the surface of the back-surface P-type structure (10) is provided with a back-surface metal layer (12). A plurality of polysilicon filling structures (11) which penetrate into the electric field stop layer (1) from the back-surface P-type structure (10) are formed in the active region (100).

10 Claims, 8 Drawing Sheets

FIELD-STOP REVERSE CONDUCTING INSULATED GATE BIPOLAR TRANSISTOR AND MANUFACTURING METHOD THEREFOR

FIELD OF THE INVENTION

The present invention relates to a manufacturing method of a semiconductor device, and particularly relates to a field-stop reverse conducting insulated gate bipolar transistor, and further relates to a manufacturing method of the field stop reverse conducting insulated gate bipolar transistor.

BACKGROUND OF THE INVENTION

The insulated gate bipolar transistor (IGBT) generally is used in a manner of a reverse parallel fly-wheel diode. However, on the one hand, this manner results in waste of the package area; on the other hand, due to the existence of parasitic effects such as a parasitic inductor, the parallel additionally increases the power consumption. Therefore, the technology of integrating the IGBT and the diode in a same chip is increasingly emphasized.

The back N+ type and the P+ type of the conventional reverse conducting insulated gate bipolar transistor (RC-IGBT) spread the whole back side of the IGBT. When turning on the diode, a large number of holes is implanted via the positive pole (the emitter of the IGBT), a part of which come into the cathode through the N-drifting region of the terminal. When recovering reversing of the diode, the holes stored below the terminal cannot be empty and disappear quickly. The recovering characteristic of the diode has to be improved by the controlling technology for the carrier lifetime such as irradiation.

SUMMARY OF THE INVENTION

On the basis of this, it is necessary to provide a field-stop reverse conducting insulated gate bipolar transistor having a better reverse recovering characteristic.

A field-stop reverse conducting insulated gate bipolar transistor includes a peripheral terminal structure and an active region surrounded by the terminal structure, a substrate of the field-stop reverse conducting insulated gate bipolar transistor being an N-type substrate, a back side of the substrate being provided with an N-type field stop layer, a side of the field stop layer away from the substrate being provided with a back P-type structure, a surface of the back P-type structure away from the substrate being provided with a back metal layer; a plurality of polysilicon filling structures are formed in the active region from the back P-type structure into the field stop layer, the plurality of polysilicon filling structures are not provided in the terminal structure.

In one of embodiments, a field limiting ring is provided in the terminal structure on a front of the substrate, a silicon oxide layer is provided on the field limiting ring; a P well is provided in the active region on the front of the substrate, an N-type emitter is provided in the P well, a gate oxide layer is provided on the front of the substrate, a polysilicon gate is provided on a surface of the gate oxide layer, the polysilicon gate is covered by the silicon oxide layer, an emitter metal structure is provided on the P well, the silicon oxide layer and the emitter metal structure is covered by a passivation layer.

In one of embodiments, both the field stop layer and the emitter are the N+ type, the back P-type structure are the P+ type.

In one of embodiments, the back metal layer and the metal structure extending into the field stop layer are aluminum-titanium-nickel-silver structures.

In one of embodiments, the field-stop reverse conducting insulated gate bipolar transistor is a plane gate insulated gate bipolar transistor.

It is also necessary to provide a manufacturing method of a field stop reverse conducting insulated gate bipolar transistor.

A manufacturing method of a field-stop reverse conducting insulated gate bipolar transistor includes the following steps: providing an N-type substrate, regarding a side of the substrate as a back side, forming an N-type field stop layer on the back side; performing a first-phrase front process; which comprising forming a high voltage-resisting structure surrounding a terminal structure through a front of the substrate of the field-stop reverse conducting insulated gate bipolar transistor, forming a gate oxide layer on a front surface of an active region area of the substrate surrounded by the terminal structure, and forming a polysilicon gate on a surface of the gate oxide layer, forming a P well in the active region area on the front of the substrate, forming an N-type emitter in the P well, forming a silicon oxide layer covering the front of the substrate and the polysilicon gate; forming a back P-type structure on a side of the field stop layer away from the substrate; performing a second-phrase front process, which comprising photoetching and etching the silicon oxide layer, forming a contact hole for exposing a part of the P well and the emitter, filling an emitter metal structure in the contact hole, forming a passivation layer covering the silicon oxide layer and the emitter metal structure; forming a back metal layer on the surfaces of the back P-type structure and the polysilicon filling structure away from the substrate.

In one of embodiments, the step of performing the first-phrase front process comprises: implanting P-type impurities to the front of the substrate by photoetching, after thermal diffusion, forming a field limiting ring as the high voltage-resisting structure; growing a field oxide layer on the front of the substrate, and photoetching and etching the field oxide layer on the active region area; growing a gate oxide layer on the front of the substrate, and forming a polysilicon layer on a surface of the gate oxide layer; removing a surplus part of the polysilicon layer and the gate oxide layer by photoetching and etching, and forming a polysilicon gate, and implanting P-type impurity ions to the substrate by a self-aligning implantation process, forming the P well after driving-in; photoetching and implanting N-type ions to the P well to form the emitter; and depositing an oxide dielectric layer, the field oxide layer and the deposited oxide dielectric layer forming the silicon oxide layer covering the front of the substrate and the polysilicon gate.

In one of embodiments, in the step of performing the first-phrase front process the step of growing the gate oxide layer on the front of the substrate is to grow a gate oxide layer with a thickness of 600 angstrom to 1500 angstrom.

In one of embodiments, the step of forming a back P-type structure on a side of the field stop layer away from the substrate, and forming a plurality of polysilicon filling structures in the active region extending from the back P-type structure into the field stop layer comprises forming the back P-type structure by implanting ions, forming a plurality of trenches from the back P-type structure into the field stop layer by photoetching and etching, and filling polysilicon in the plurality of trenches to form the polysilicon filling structures; both the field stop layer and the emitter are the N+ type, the back P-type structure is the P+ type.

In one of embodiments, prior to the step of forming a back P-type structure on a side of the field stop layer away from the substrate, and forming a plurality of polysilicon filling structures in the active region extending from the back P-type structure into the field stop layer, the method further comprises a step of forming a front protecting layer on the silicon oxide layer; after the step of forming a back P-type structure on a side of the field stop layer away from the substrate, and forming a plurality of polysilicon filling structures in the active region extending from the back P-type structure into the field stop layer but prior to the step of performing a second-phrase front process, the method further comprises a step of removing the front protecting layer.

The field-stop reverse conducting insulated gate bipolar transistor described above does not form a polysilicon filling structure in the terminal structure. Therefore, when turning on the diode, only a few part of holes flow through the drifting region of the terminal structure, reducing the magnitude of the recovering current when recovering of the built-in the diode and then improving the reverse recovering capacity of the built-in diode. Further, the polysilicon rather than N+ conductive structure is used to implement the reverse conducting function. Because the resistivity of the polysilicon can be adjusted more easily, the characteristics of IGBT and built-in diode thereof can be compromised more easily.

DETAILED DESCRIPTION OF THE EMBODIMENTS

The details of one or more embodiments of the invention are set forth in the accompanying drawings and the description below. Other features, objects, and advantages of the invention will be apparent from the description and drawings, and from the claims.

Figure 1:
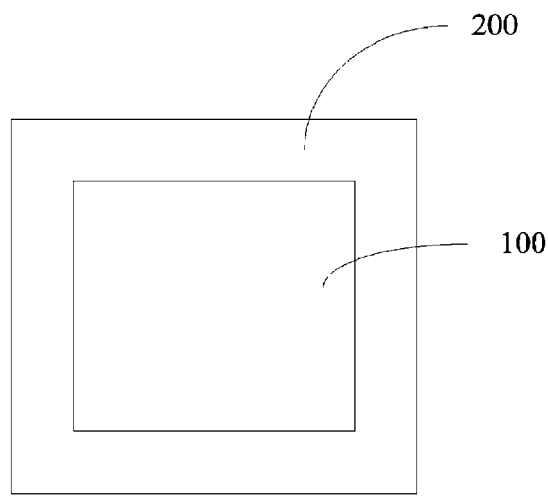
FIG. 1 is a top view of a terminal structure and an active region of a field-stop reverse conducting insulated gate bipolar transistor in an embodiment.
Figure 2:
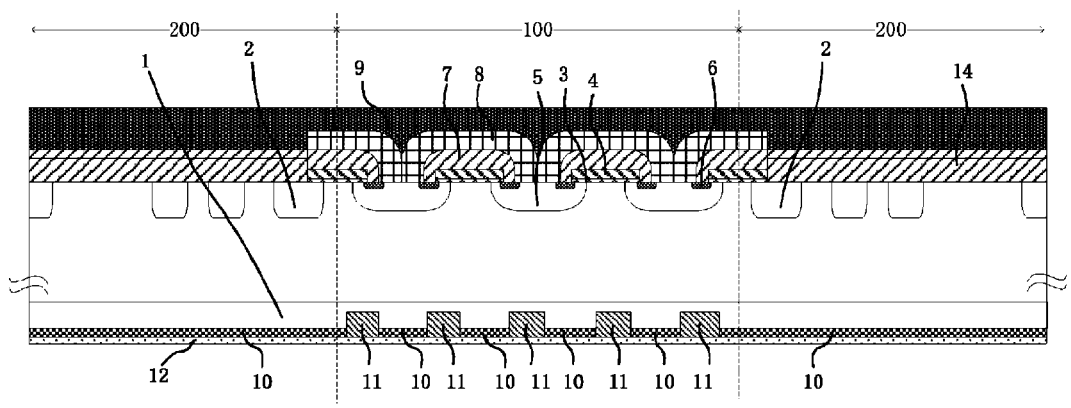
FIG. 2 is a cross-section view of the field-stop reverse conducting insulated gate bipolar transistor in an embodiment.

FIG. 1 is a top view of the terminal structure and the active region of the field-stop reverse conducting insulated gate bipolar transistor in an embodiment, FIG. 2 is a cross-section view of the field-stop reverse conducting insulated gate bipolar transistor in an embodiment. The field-stop reverse conducting insulated gate bipolar transistor includes a peripheral terminal structure 200 and an active region 100 surrounded by the terminal structure 200. In the illustrated embodiment shown in FIG. 2, a substrate of the field-stop reverse conducting insulated gate bipolar transistor is an N-type substrate. A back side of the substrate is provided with an N-type field stop layer 1 (i.e. the field stop layer), and a doping concentration of the field stop layer 1 is greater than that of the substrate. A side of the field stop layer 1 away from the substrate is provided with a back layer P-type structure 10. A surface of the back P-type structure 10 away from the substrate is provided with a back metal layer 12. In the embodiment, the back metal layer 12 employs the Al—Ti—Ni—Ag structure. A plurality of polysilicon filling structures 11 are formed in the active region 100 from the back P-type structure into the field stop layer 1. The plurality of polysilicon filling structures 11 are formed by firstly forming a plurality of trenches through the back P-type structure 10 into the field stop layer 1 and then filling polysilicon in the plurality of trenches. The plurality of polysilicon filling structures 11 are not provided in the terminal structure 200.

The field-stop reverse conducting insulated gate bipolar transistor described above does not form a polysilicon filling structure in the terminal structure 200. Therefore, when turning on the diode, only a few part of holes flow through the drifting region of the terminal structure 200, reducing the magnitude of the recovering current when recovering of the built-in the diode and then improving the reverse recovering capacity of the built-in diode. Further, the polysilicon rather than N+ conductive structure is used to implement the reverse conducting function. Because the resistivity of the polysilicon can be adjusted more easily, the characteristics of IGBT and built-in diode thereof can be compromised more easily.

The embodiment shown in the FIG. 2 uses a plane gate insulated gate bipolar transistor as an example to illustrate the structure of IGBT. It can be understood that, hereinabove, the back structure of the plurality of polysilicon filling structures 11 is formed only in the active region 100, which can be also applied to the trench gate IGBT.

Referring to FIG. 2, a P-type field limiting ring 2 is provided in the terminal structure 200 on a front of the substrate. A plurality of the field limiting rings 2 can be provided, the number of which is omitted in FIG. 2. A silicon oxide layer 14 and an oxide dielectric layer 7 are provided on the field limiting ring 2, and a silicon oxide layer is formed by the field oxide layer 14 and the oxide dielectric layer 7.

A P well 5 is provided in the active region 100 on the front of the substrate, an N-type emitter 6 is provided in the P well 5. A gate oxide layer 3 is provided on the front of the substrate, a polysilicon gate 4 is provided on a surface of the gate oxide layer 3, the polysilicon gate 4 is also covered by the silicon oxide layer (the oxide dielectric layer 7). The polysilicon gate 4 is provided between two adjacent P wells 5, and between a P well 5 at boundary of the active region 100 and the terminal structure 200 and a field limiting ring 2. An emitter metal structure 8 is provided on the P well 5, the silicon oxide layer and the emitter metal structure 8 is covered by a passivation layer 9. The function of the passivation layer 9 is to prevent the surface of the chip from contaminating of the external ions. In the embodiment, the material of the passivation layer 9 is SiN.

In the embodiment as shown in FIG. 2, both the field stop layer 1 and the emitter 6 are the N+ type, the back P-type structure 10 are the P+ type.

Figure 3:
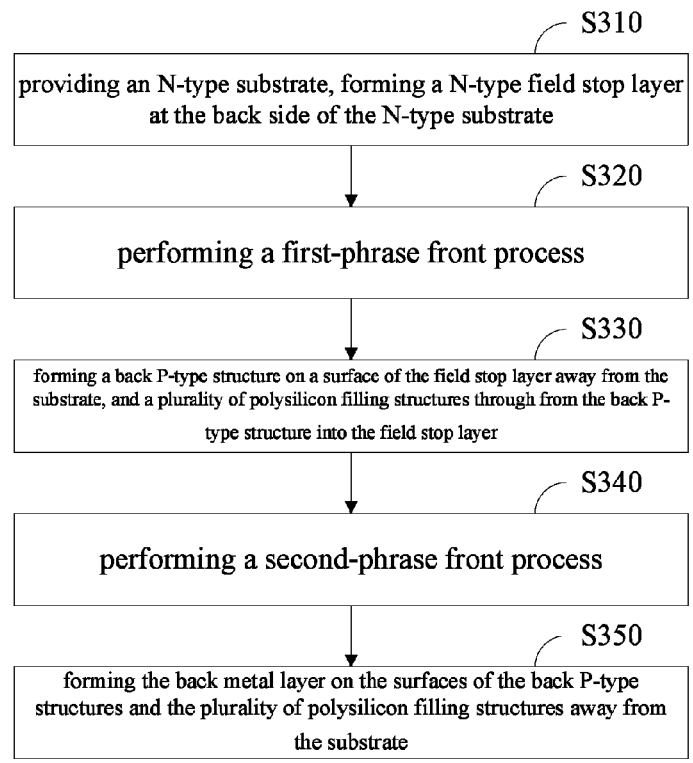
FIG. 3 shows a flow chart of a manufacturing method of the field-stop reverse conducting insulated gate bipolar transistor in an embodiment.

As shown in FIG. 3, a manufacturing method of a field-stop reverse conducting insulated gate bipolar transistor comprises the following steps: S310, providing an N-type substrate, forming an N-type field stop layer on the back side of the N-type substrate.

Figure 4A:
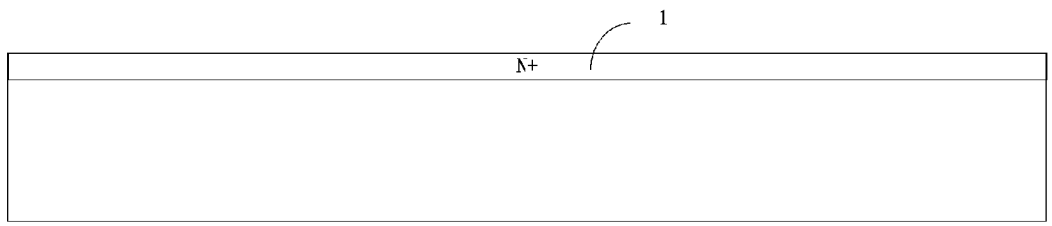
FIGS. 4A to 4L are cross-section views during manufacturing the field-stop reverse conducting insulated gate bipolar transistor in an embodiment.

Referring to FIG. 4A, in the embodiment, a doping concentration of the N+ field stop layer 1 is greater than that of the substrate.

S320, performing a first-phrase front process.

Figure 4B:
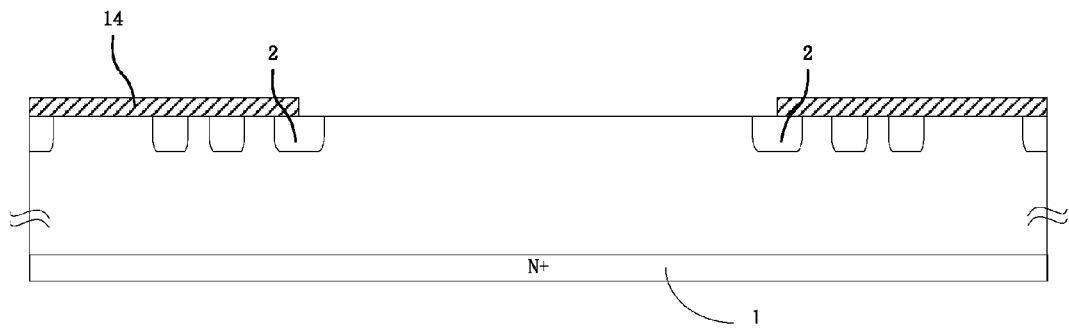
Figure 4C:
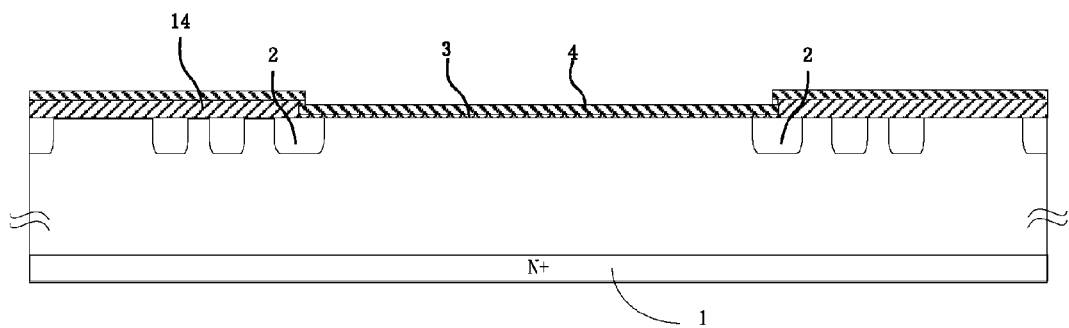
Figure 4D:
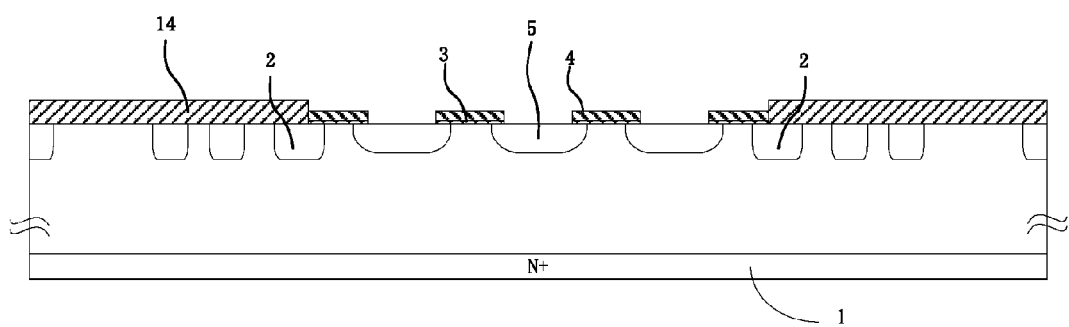
Figure 4E:
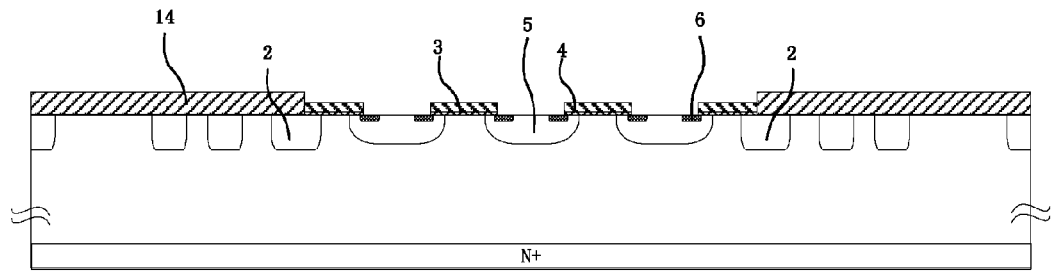
Figure 4F:
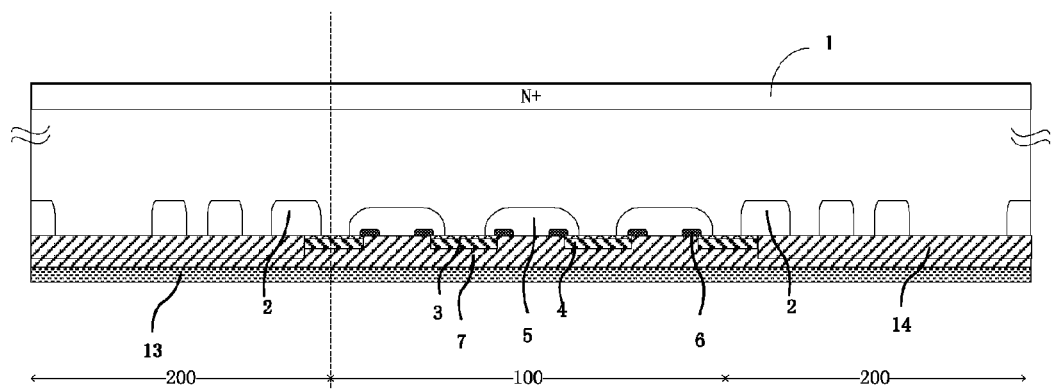

FIG. 4F shows a cross-section view of the field-stop reverse conducting insulated gate bipolar transistor after the step S320 is performed. The step S320 specifically comprises forming a high voltage-resisting structure surrounding the terminal structure 200 area on the front of the substrate of the field-stop reverse conducting insulated gate bipolar transistor, forming a gate oxide layer 3 on a front surface of an active region 100 area of the substrate surrounded by the terminal structure 200, and forming a polysilicon gate 4 over a surface of the gate oxide layer 3, forming a P well 5 in the active region 100 area on the front of the substrate, forming an N-type emitter 6 in the P well 5, forming a silicon oxide layer covering the front of the substrate and the polysilicon gate. The silicon oxide layer is formed by the field oxide layer 14 and the oxide dielectric layer 7.

In the embodiment shown in the FIG. 4F, in order to prevent the wafer from damaging the front structure thereof when performing the back process, after forming the silicon oxide layer, it further comprises the step of forming a front protecting layer 13 on the silicon oxide layer.

S330, forming a back P-type structure on a side of the field stop layer away from the substrate, and forming a plurality of polysilicon filling structures in the active region from the back P-type structure into the field stop layer.

Figure 4G:
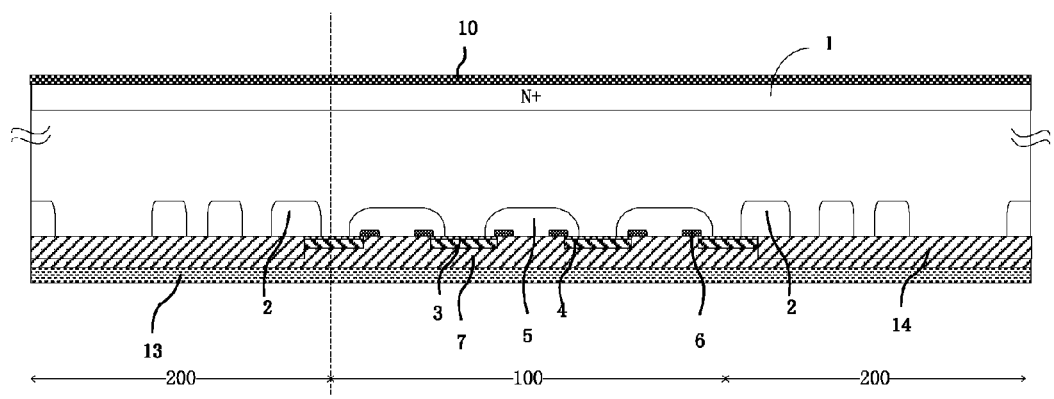
Figure 4H:
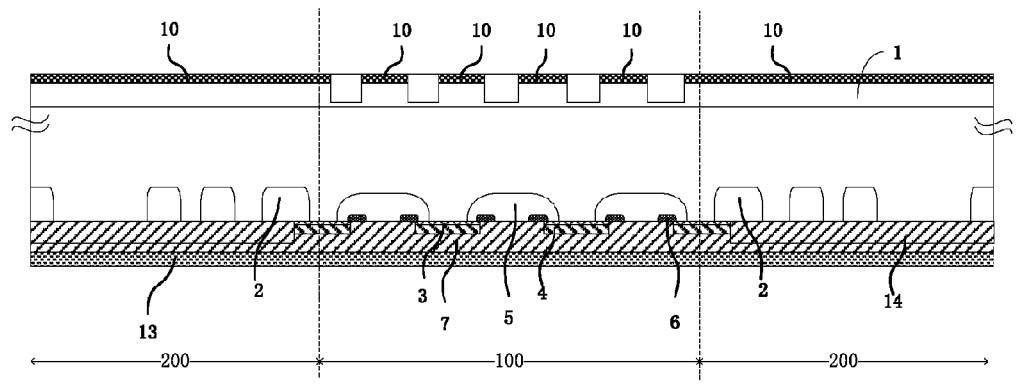
Figure 4I:
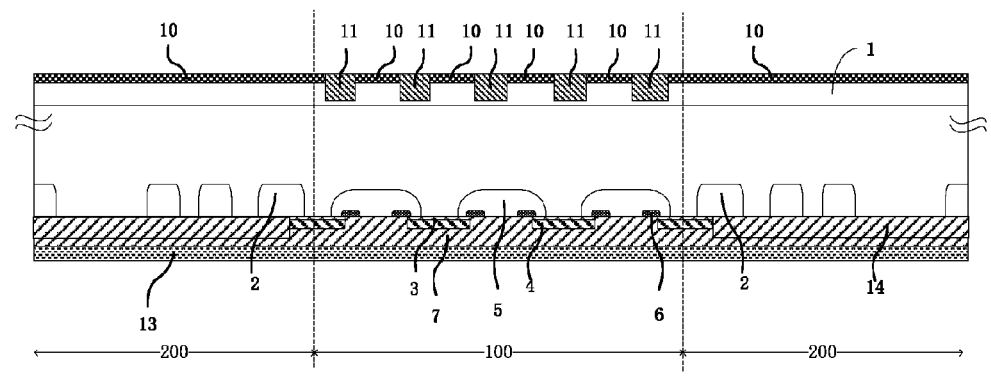
Figure 4J:
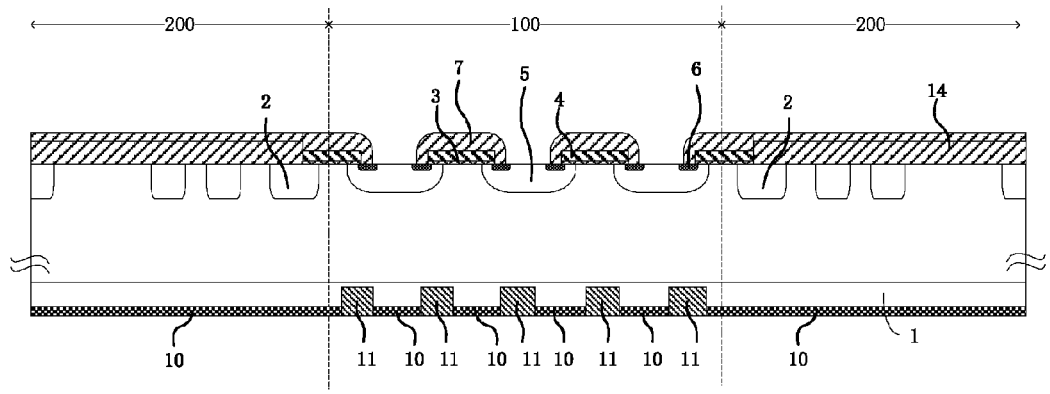

FIG. 4I shows a cross-section view of the field-stop reverse conducting insulated gate bipolar transistor after the step S330 is performed. After the step S330 is performed it needs to remove the front protecting layer 13.

S340, performing a second-phrase front process.

Figure 4K:
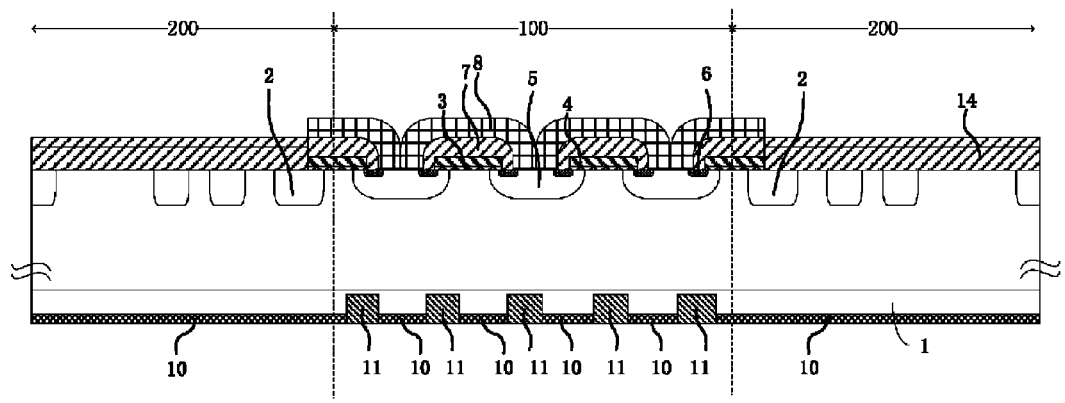
Figure 4L:
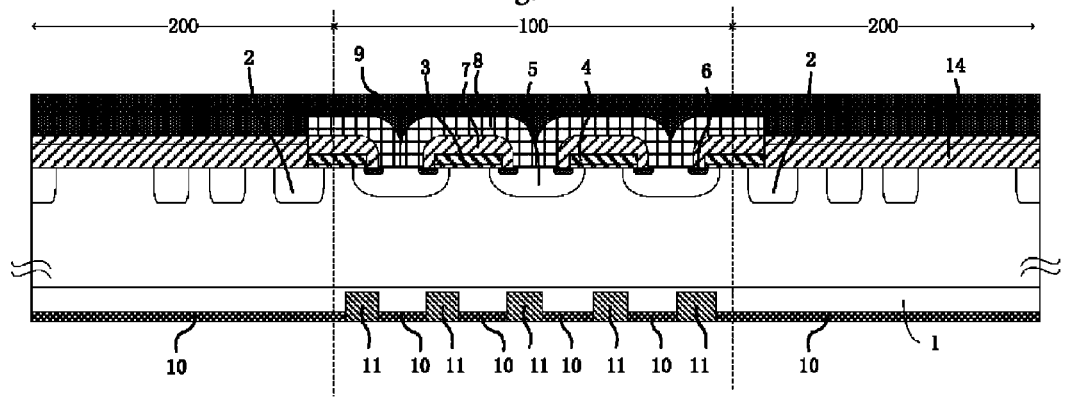

FIG. 4L shows a cross-section view of the field-stop reverse conducting insulated gate bipolar transistor after the step S340 is performed. The second-phrase front process specifically comprises photoetching and etching the oxide dielectric layer 7, forming a contact hole for exposing a part of the P well 5 and the emitter 6, filling an emitter metal structure 8 in the contact hole, then forming a passivation layer 9. The silicon oxide layer and the emitter metal structure 8 is covered by the passivation layer 9. The function of the passivation layer 9 is to prevent the surface of the chip from contaminating of the external ions. In the embodiment, the material of the passivation layer 9 is SiN.

S350, forming a back metal layer on the back P-type structure and the surfaces of the plurality of polysilicon filling structures away from the back metal layer.

Referring to FIG. 2, in the embodiment, the back metal layer 12 employs an Al—Ti—Ni—Ag structure.

The devices manufactured by the manufactured method of the field-stop reverse conducting insulated gate bipolar transistor described above do not form a polysilicon filling structure 11 in the terminal structure 200. Therefore, when turning on the diode, only a few part of holes flow through the drifting region of the terminal structure 200, reducing the magnitude of the recovering current when recovering of the built-in the diode and then improving the reverse recovering capacity of the built-in diode. Further, the polysilicon rather than N+ conductive structure is used to implement the reverse conducting function. Because the resistivity of the polysilicon can be adjusted more easily, the characteristics of IGBT and built-in diode thereof can be compromised more easily.

On the other hand, the manufacturing process of RC-IGBT in the conventional technology generally performs two back photoetching processes after the front process is performed. In other words, firstly the photoetching, implantation and diffusion processes are performed to form the P+ type area, and then the photoetching, implantation and diffusion processes are performed again to form the N+ type area. Because forming of the metal layer has been done in the front process, the following annealing process can only employ a lower temperature, and it is difficult to obtain a better annealing effect.

However, the manufacturing method of a field-stop reverse conducting insulated gate bipolar transistor described above employs two steps to perform the front process, making for the back P-type structure 10 is in advance of making for the metal layer (i.e. the emitter metal structure) of the front process, thus prior to forming the emitter metal structure 8, a higher temperature can be applied to an annealing process, obtaining a higher activity ratio of implanting ions to the back side.

Figure 5:
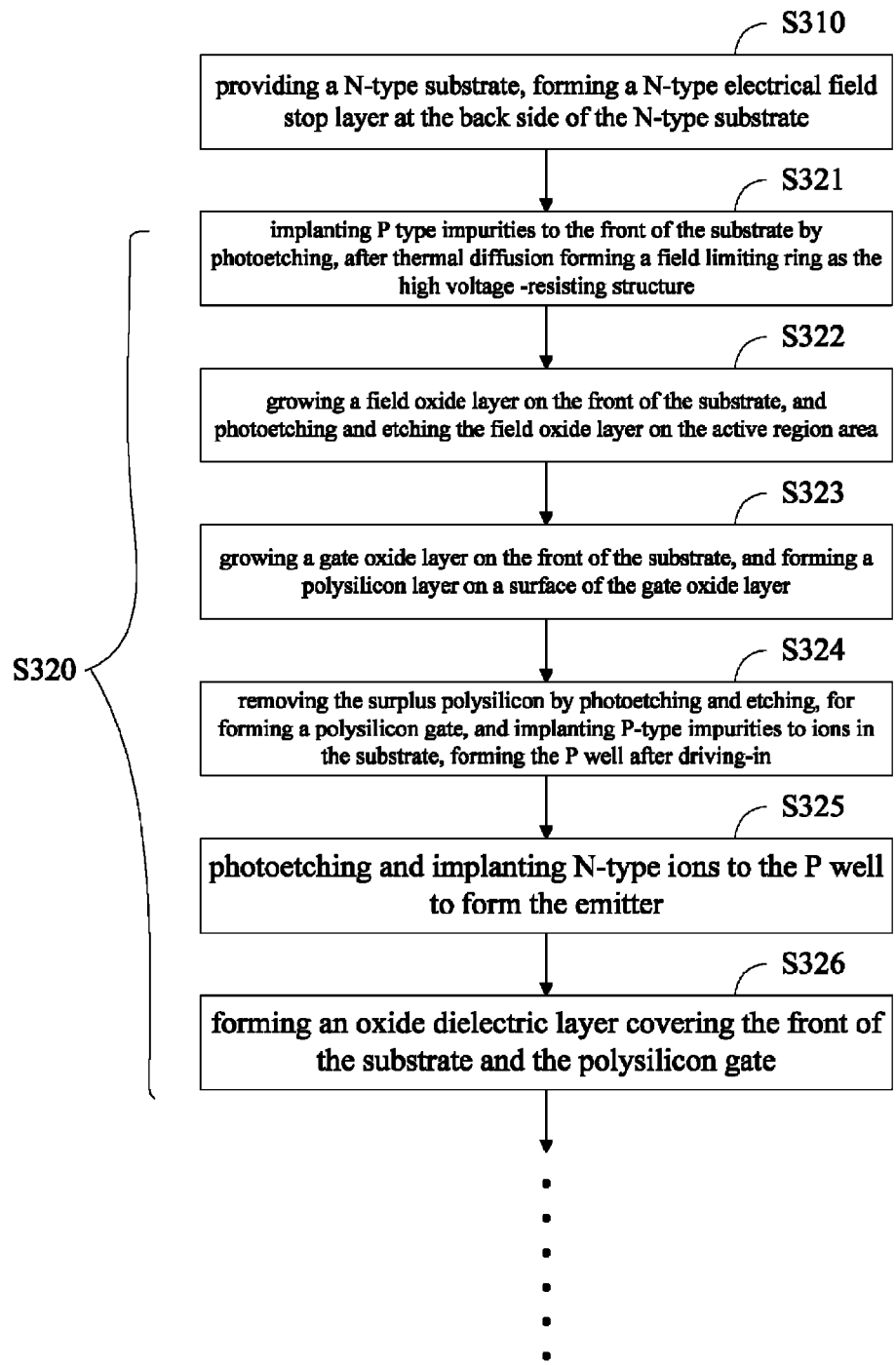
FIG. 5 shows a specific flow chart of the step S320 in an embodiment.

Referring to FIG. 5, in one of embodiments, S320 specifically comprises the following steps:

S321, implanting P-type impurities on the front of the substrate by photoetching, after thermal diffusion forming a field limiting ring 2 as the high voltage-resisting structure.

In the embodiment the field limiting ring is used as the high voltage-resisting structure. In other embodiments the field plate can be also used as the high voltage-resisting structure. Or it can be the high voltage-resisting structure of the field limiting ring plus the field plate, or the high voltage-resisting structure for other terminals.

S322, growing a field oxide layer 14 on the front of the substrate, and photoetching and etching the field oxide layer 14 on the active region area.

FIG. 4B shows a cross-section view of the field-stop reverse conducting insulated gate bipolar transistor after the step S322 is performed.

S323, growing a gate oxide layer above the front of the substrate, and forming a polysilicon layer over a surface of the gate oxide layer.

FIG. 4C shows a cross-section view of the field-stop reverse conducting insulated gate bipolar transistor after the step S323 is performed. In the embodiment, growing the gate oxide layer with a thickness of 600 angstrom to 1500 angstrom by the thermal oxidation, then depositing and forming the polysilicon layer 4 on the surface of the gate oxide layer 3.

S324, removing a surplus part of the polysilicon layer and the gate oxide layer by photoetching and etching, for forming a polysilicon gate, and implanting P-type impurity ions to the substrate, forming the P well after driving-in.

FIG. 4D shows a cross-section view of the field-stop reverse conducting insulated gate bipolar transistor after the step S324 is performed. In the embodiment, the ions are implanted by a self-aligning implantation process for forming the P well 5.

S325, photoetching and implanting N-type ions to the P well to form the emitter.

FIG. 4E shows a cross-section view of the field-stop reverse conducting insulated gate bipolar transistor after the step S325 is performed. After an N+ implantation window is formed by photoetching, the N+ emitter 6 is formed by implanting and driving-in of ions.

S326, forming the oxide dielectric layer covering the front of the substrate and the polysilicon gate.

Referring to FIG. 4F, in the embodiment, forming the oxide dielectric layer 7 by depositing, and then forming the previous front protecting layer 13 by using a furnace tube. Therefore, a protecting layer is also formed on the back side of the wafer, it needs to remove that on the back side prior to the step S330 is performed.

Figure 6:
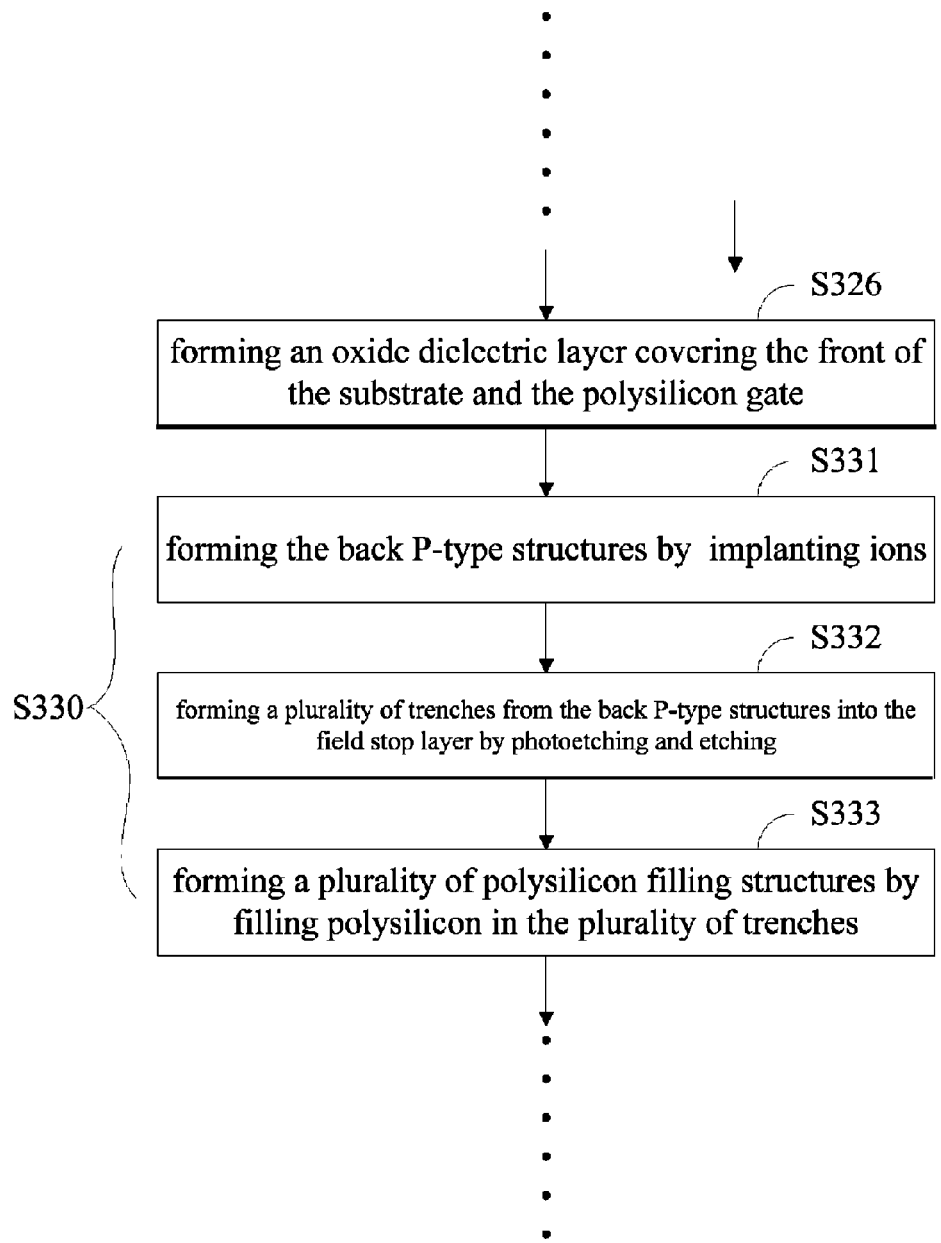
FIG. 6 shows a specific flow chart of the step S330 in an embodiment.

The step S330 is performed after the step S326 is performed. Referring to FIG. 6, in one of embodiments, S330 specifically comprises the following steps:

S331, the P-type ions can be implanted for forming the back P-type structure.

FIG. 4G shows a cross-section view of the field-stop reverse conducting insulated gate bipolar transistor after the step S331 is performed. The P-type ions can be implanted after photoetching, for forming the P+ back P-type structure 10.

FIG. 4H shows a cross-section view of the field-stop reverse conducting insulated gate bipolar transistor after the step S331 is performed. A plurality of trenches of a width and depth can be formed in the active region 100 on the back side by photoetching and etching.

S333, forming a plurality of polysilicon filling structures by filling polysilicon in the plurality of trenches.

FIG. 4I shows a cross-section view of the field-stop reverse conducting insulated gate bipolar transistor after the step S331 is performed. The plurality of polysilicon filling structures 11 are formed by filling polysilicon of a resistivity in the plurality of trenches. After forming of the plurality of polysilicon filling structures 11 is performed, the front protecting layer 13 is removed, and then the method goes into step S340.

Referring to FIG. 4K, in the embodiment, the emitter metal structure 8 is formed by a sputtering process, and it needs to remove a surplus part of metal by the photoetching and etching process.

Referring to FIG. 4L, in the embodiment, the passivation layer 9 is formed by the chemical vapour deposition process, and it requires a pad area (not shown in FIG. 4L) for leading the gate electrode and the emitter electrode out, which is formed by photoetching and etching.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A field-stop reverse conducting insulated gate bipolar transistor, comprising:
   a peripheral terminal structure;
   and an active region surrounded by the terminal structure;
   a substrate of the field-stop reverse conducting insulated gate bipolar transistor being an N-type substrate, a back side of the substrate being provided with an N-type field stop layer, a side of the field stop layer away from the substrate being provided with a back P-type structure, a surface of the back P-type structure away from the substrate being provided with a back metal layer;
   characterized in that, a plurality of polysilicon filling structures are formed in the active region extending through the back P-type structure into the field stop layer, the plurality of polysilicon filling structures are not provided in the terminal structure.

2. The field-stop reverse conducting insulated gate bipolar transistor of claim 1, characterized in that:
   a field limiting ring is provided in the terminal structure on the front of the substrate, a silicon oxide layer is provided on the field limiting ring;
   a P well is provided in the active region on the front of the substrate;
   an N-type emitter is provided in the P well;
   a gate oxide layer is provided above the front of the substrate;
   a polysilicon gate is provided on a surface of the gate oxide layer;
   the polysilicon gate is covered by the silicon oxide layer;
   an emitter metal structure is provided on the P well; and
   the silicon oxide layer and the emitter metal structure are covered by a passivation layer.

3. The field-stop reverse conducting insulated gate bipolar transistor of claim 2, characterized in that, both the field stop layer and the emitter are the N+ type, and the P-type structure is the P+ type.

4. The field-stop reverse conducting insulated gate bipolar transistor of claim 1, characterized in that, the metal layer and the metal structure extending into the field stop layer are aluminum-titanium-nickel-silver structures.

5. The field-stop reverse conducting insulated gate bipolar transistor of claim 1, characterized in that, the field-stop reverse conducting insulated gate bipolar transistor is a plane gate insulated gate bipolar transistor.

6. A manufacturing method of a field-stop reverse conducting insulated gate bipolar transistor, comprising the following steps:
   providing an N-type substrate comprising an N-type field stop layer on a back side thereof;
   performing a first phase front process comprising:
      forming a high voltage-resisting structure surrounding a terminal structure on a front of the substrate of the field stop reverse conducting insulated gate bipolar transistor,
      forming a gate oxide layer on a front surface of an active region area of the substrate surrounded by the terminal structure,
      forming a polysilicon gate over a surface of the gate oxide layer,
      forming a P-well in the active region area on the front of the substrate,
      forming an N-type emitter in the P-well, forming a silicon oxide layer covering the front of the substrate and the polysilicon gate,
      forming a back P-type structure on a side of the field stop layer away from the substrate, and
      forming a plurality of polysilicon filling structures in the active region extending from the back P-type structure into the field stop layer;
   performing a second phase front process; which comprising photoetching and etching the silicon oxide layer, forming a contact hole for exposing a part of the P well and the emitter, filling an emitter metal structure in the contact hole, forming a passivation layer covering the silicon oxide layer and the emitter metal structure;
   and
   forming a back metal layer on the surfaces of the back P-type structure and the polysilicon filling structure away from the substrate.

7. The manufacturing method of the field-stop reverse conducting insulated gate bipolar transistor of claim 6, characterized in that, the step of performing the first-phase front process comprises:
   implanting P-type impurities to the front of the substrate by photoetching, after thermal diffusion;
   forming a field limiting ring as the high voltage-resisting structure;
   growing a field oxide layer on the front of the substrate;

photoetching and etching the field oxide layer above the active region area;

growing a gate oxide layer on the front of the substrate;

forming a polysilicon layer over a surface of the gate oxide layer;

removing a surplus part of the polysilicon layer and the gate oxide layer by photoetching and etching;

forming a polysilicon gate;

implanting P-type impurity ions to the substrate by a self-aligning implantation process, forming the P well after driving-in;

photoetching and implanting N-type ions to the P well to form the emitter; and depositing an oxide dielectric layer, the field oxide layer and the deposited oxide dielectric layer forming the silicon oxide layer covering the front of the substrate and the polysilicon gate.

8. The manufacturing method of the field-stop reverse conducting insulated gate bipolar transistor of claim 7, characterized in that, in the step of performing the first phase front process, the gate oxide layer on the front of the substrate with a thickness of 600 angstrom is grown to a thickness of 1500 angstrom.

9. The manufacturing method of the field-stop reverse conducting insulated gate bipolar transistor of claim 7, characterized in that, the step of forming a back P-type structure on a side of the field stop layer away from the substrate, and forming a plurality of polysilicon filling structures in the active region extending from the back P-type structure into the field stop layer comprises:

forming the back P-type structure by implanting ions;

forming a plurality of trenches from the back P-type structure into the field stop layer by photoetching and etching; and filling polysilicon in the plurality of trenches to form the polysilicon filling structures;

wherein both the field stop layer and the emitter are the N+ type, and the back P-type structure is the P+ type.

10. The manufacturing method of a field-stop reverse conducting insulated gate bipolar transistor of claim 6, characterized in that:

prior to the step of forming a back P-type structure on a side of the field stop layer away from the substrate, and forming a plurality of polysilicon filling structures in the active region extending from the back P-type structure into the field stop layer, the method further comprises a step of forming a front protecting layer on the silicon oxide layer; and after the step of forming a back P-type structure on a side of the field stop layer away from the substrate, and forming a plurality of polysilicon filling structures in the active region extending from the back P-type structure into the field stop layer and prior to the step of performing a second phase front process, the method further comprises a step of removing the front protecting layer.

\* \* \* \* \*